United States Patent [19]

Brannigan et al.

[11] Patent Number: 5,896,039
[45] Date of Patent: Apr. 20, 1999

[54] CONFIGURABLE PROBE PADS TO FACILITATE PARALLEL TESTING OF INTEGRATED CIRCUIT DEVICES

[75] Inventors: Michael Joseph Brannigan, Highland Village; Mark Alan Lysinger; David Charles McClure, both of Carrollton, all of Tex.

[73] Assignee: STMicroelectronics, Inc., Carrollton, Tex.

[21] Appl. No.: 08/878,613

[22] Filed: Jun. 19, 1997

Related U.S. Application Data

[62] Division of application No. 08/456,181, May 31, 1995, abandoned.

[51] Int. Cl.[6] .................................................. G01R 31/28
[52] U.S. Cl. ........................................ 324/763; 324/765
[58] Field of Search .............................. 324/73.1, 158.1, 324/763, 537, 765; 257/203, 40, 48; 438/14, 17; 371/22.4, 22.5, 22.6, 22.7

[56] References Cited

U.S. PATENT DOCUMENTS

| | | | |
|---|---|---|---|
| 3,781,683 | 12/1973 | Freed | 324/765 |
| 4,243,937 | 1/1981 | Multani et al. | 29/574 |
| 4,288,911 | 9/1981 | Ports | 324/764 |
| 4,479,088 | 10/1984 | Stopper | 324/525 |
| 4,743,841 | 5/1988 | Takeuchi | 324/763 |
| 4,782,283 | 11/1988 | Zasio | 321/763 |
| 4,853,628 | 8/1989 | Gouldsberry et al. | 324/763 |
| 4,961,053 | 10/1990 | Krug | 324/73.1 |
| 5,053,700 | 10/1991 | Parrish | 324/537 |
| 5,184,162 | 2/1993 | Saitoh et al. | 371/22.5 |
| 5,371,457 | 12/1994 | Lipp | 324/158.1 |
| 5,389,556 | 2/1995 | Rostoker et al. | 438/17 |

*Primary Examiner*—Vinh P. Nguyen
*Attorney, Agent, or Firm*—Theodore E. Galanthay; Lisa K. Jorgenson; R. Michelle Larson

[57] ABSTRACT

Parallel testing of integrated circuit devices are facilitated such that it is not necessary that integrated circuit devices to be parallel tested be "ends only" devices. A side pad located along the sides, rather than the ends, of the integrated circuit device is electrically connected by multiplexing circuitry to a corresponding configurable probe pad located along the ends of the device. During parallel testing of the device, the side pad is effectively tested when the configurable probe pad is probed and tested. While the configurable probe pad is tested during parallel testing, the side pad is not directly exercised. Following parallel testing, the side pad is bonded to the device package but the configurable probe pad is not bonded to the device package.

11 Claims, 5 Drawing Sheets

CONFIGURABLE PROBE PADS TO FACILITATE PARALLEL TESTING OF INTEGRATED CIRCUIT DEVICES

BACKGROUND OF THE INVENTION

This is a Division of application Ser. No. 08/456,181, filed May 31, 1995, now abandoned.

The present invention relates generally to integrated circuit device testing, and more specifically to parallel testing of integrated circuit devices.

Testing is performed throughout the manufacture and assembly of integrated circuit devices, such as at wafer sort where the speed grade of a device may be determined. Integrated circuit devices subjected to parallel testing are typically placed side by side on a wafer, and the pads of the integrated circuit devices are then probed by a tester in order to test the electrical soundness of the devices. Because the integrated circuit devices are placed side by side next to each other, parallel testing is performed on "ends only" devices or integrated circuit devices whose pads are arranged along the two opposite ends, and not along all four sides of the device. Typically, then, "ends only" integrated circuit devices can be small density parts, and are usually rectangular in shape having an aspect ratio defined as the length to width dimensions of the device. The pads of the device are arranged only along opposite ends of the device to easily allow for parallel testing of the integrated circuit device simultaneously with other identical integrated circuit devices. Parallel testing could additionally be performed on a square die device if it had very few pads which were arranged along just two opposite sides of the die.

Small density integrated circuit devices are often "ends only" devices by virtue of their relatively small die size and limited number of pads. These pads must be probed during testing of the device, and thus lend themselves to parallel testing. Parallel testing of small density integrated circuit devices may not be necessary. Because of the relative lack of complexity of such small density integrated circuit devices, testing may be accomplished in relatively short order and thus testing time does not pose a significant concern to manufacturers of these devices. Thus, although testing time of small density integrated circuit devices could be reduced by parallel testing of two or more "ends only" devices side by side simultaneously, this option may not be pursued where testing time is not a concern for small density integrated circuit devices.

As integrated circuit devices have become larger, more dense and complex, however, the issue of test time reduction has become increasingly important as the time required to test higher density devices has increased in proportion to the complexity of the device. A logical approach to address the issue of test time reduction, is to test more than one integrated circuit device at a time, i.e. to perform parallel testing of two or more integrated circuit devices simultaneously.

A recent trend in integrated circuit memory devices has been to make most memory densities available in a variety of packages, and more recently in packages that are 300 mils in width. This necessitates a bonding configuration similar to that seen for the 1 Meg SRAM shown in FIG. 1. The assembly requirements shown in FIG. 1 are pertinent to any 300 mil device using similar lead frames. Additionally, other package types such as a DIP (dual in-line package) or SOJ may be used. The assembly demands for a larger density integrated circuit device, such as a 1 Meg SRAM (Static Random Access Memory) shown in FIG. 1, however, often dictate the placement of distributed pads along the long dimension of the die in order to optimize bonding to the device lead frame. Larger density integrated circuit devices, then, are typically not "ends only" devices and thus are not easily adaptable to parallel testing. The large number of pads to be tested in larger density and complex devices simply can not all be placed just along two opposite ends of the device. Thus, while large density integrated circuit devices could benefit from the reduced test time offered by parallel testing, the non-"ends only" configuration characteristic of most large density integrated circuit devices does not really allow for parallel testing.

SUMMARY OF THE INVENTION

It would be advantageous in the art to facilitate parallel testing of larger density integrated circuit devices which are not "ends only" devices, for assembly or other reasons.

Therefore, according to the present invention, parallel testing of integrated circuit devices are facilitated such that it is not necessary that integrated circuit devices to be parallel tested be "ends only" devices. A side pad located along the sides, rather than the ends, of the integrated circuit device is electrically connected by multiplexing circuitry to a corresponding configurable probe pad located along the ends of the device. During parallel testing of the device, the side pad is effectively tested when the configurable probe pad is probed and tested. Following parallel testing, the side pad is bonded to the device package but the configurable probe pad is not bonded to the device package. A power supply such as Vcc may be applied to a second configurable probe pad to ensure that all other configurable probe pads are disconnected from their corresponding side pads during normal device operation. The method and circuitry of the present invention has no negative impact on integrated circuit device performance and additionally have no undesirable effect on area management of the device.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 2b 300 mil SOJ (Small Outline J-Lead) integrated circuit device which illustrates the connection of bonding wires to side pads, according to the present invention;

DESCRIPTION OF THE INVENTION

The present invention facilitates parallel testing of integrated circuit devices which are not necessarily "ends only" devices, meaning that it is not necessary that all pads to be tested be "end" pads permanently located along opposite ends of the integrated circuit device. Configurable probe pads placed along two opposite ends of the device, corresponding to actual probe pads of the device which are not located along two opposite ends of the device, allow the integrated circuit device to be probed during parallel testing, such as during wafer sort, as if the integrated circuit device were actually an "ends only" device. As is well known in the art, probing means to make electrical contact with a tester. Following parallel testing of the integrated circuit device, all but at least one of the configurable probe pads are not bonded to the device package but are instead tied to a predetermined logic state to ensure that the configurable probe pads are turned off during normal device operation.

Figure 1:
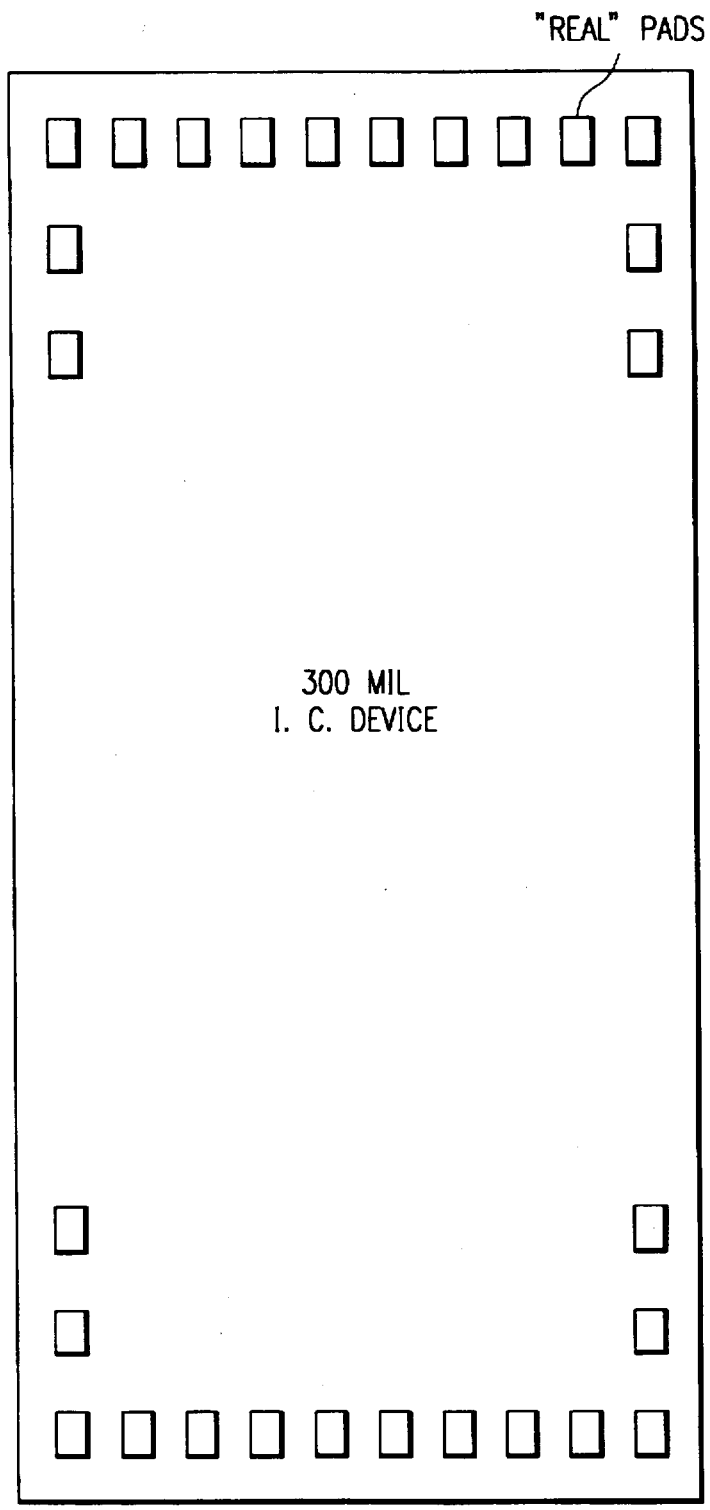
FIG. 1 is a pad diagram of a 28-pin 300 mil SOJ (Small Outline J-Lead) integrated circuit device, according to the prior art.

Referring to FIG. 1, a pad diagram of a 28-pin 300 mil SOJ (Small Outline J-Lead) integrated circuit device, according to the prior art, is shown. The 28-pin 300 mil SOJ device is a rectangular device having an aspect ratio, length to width ratio, of more than 1:1, meaning that the length dimension which corresponds to the sides of the device is greater than the width dimension which corresponds to the ends of the device. The 28-in 300 mil SOJ is just an example of an integrated circuit device which may utilize the present invention; other package types, such as SOIC (Surface Outline I.C.) and DIP (Dual In-line Package) may also utilize the present invention. In keeping with the assembly requirements of the device, the 28-pin 300 mil SOIC device is not an "ends only" device but instead has several pads located along the opposite length dimensions of the device which renders a non-"ends only" device. This device, as well as other non-"ends only" devices, do not allow for parallel testing of the device since all pads to be probed during wafer sort or some other test are not on the two opposing ends of the device and are therefore not accessible during testing. Such a device may not be tested side by side to another identical device at probe.

Figure 2:
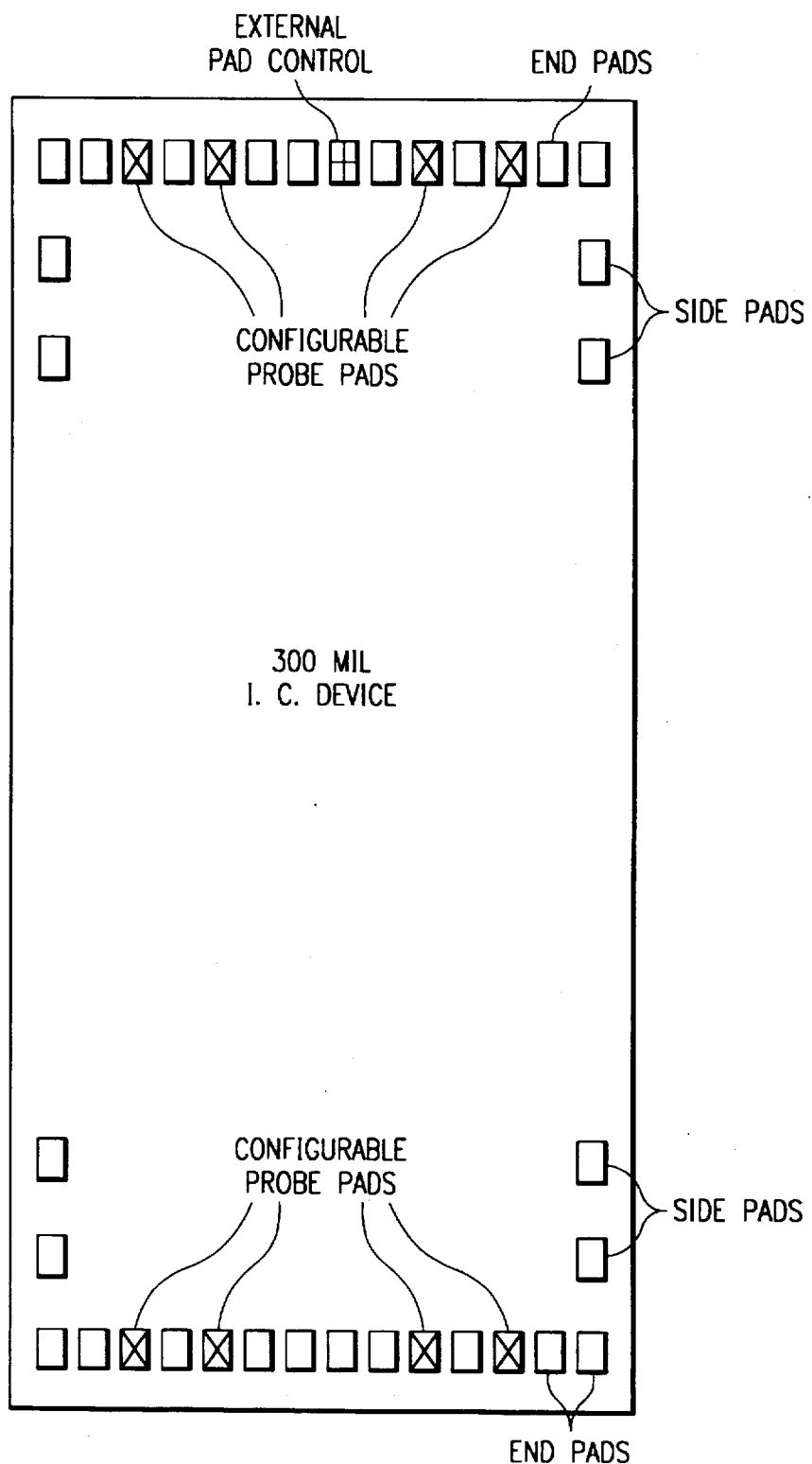
FIG. 2 is a pad diagram of a 28-pin 300 mil SOJ (Small Outline J-Lead) integrated circuit device, according to the present invention.

The present invention allows a non-"ends only" integrated circuit device to be tested as if it were actually an "ends only" device. This is accomplished through the placement of additional configurable probe pads which allow pads located along the sides and not on the ends of the device, which may be referred to as "side" pads since they are located along the sides of the device, to be probed during parallel testing as if they were actually located on the ends of the device. A side pad is bonded to the package of the device during packaging and is selectively connected to a configurable probe pad which is shown in FIG. 2. In this manner, parallel testing of integrated circuit devices, especially larger density integrated circuit devices, which are not "ends only" devices may be performed. Referring to FIG. 2, a pad diagram of a 28-pin 300 mil SOJ device, according to the present invention, is shown. The 28-pin 300 mil SOJ device has additional configurable probe pads placed along opposite ends of the device to allow for parallel testing of this device in conjunction with identical testing of other identical device types simultaneously. An additional configurable probe pad located along an end of the device is constructed in the same data layers as its corresponding side pad; a configurable probe pad may be the same size as its corresponding side pad.

Assembly requirements dictate distributed pads along the long dimension of the die to optimize bonding for this lead frame. FIG. 2 shows the placement of additional configurable probe pads along the end or ends of the device that will only be probed and typically not bonded in the finished packaged device. The additional configurable probe pads may be placed between regular end pads, as shown in FIG. 2, in order to minimize the amount of device space used. These additional configurable probe pads allow the device to be parallel tested as if it were really an "ends only" device. Thus devices having configurable probe pads can then be tested in parallel and a significant test time reduction realized.

Figure 2A:
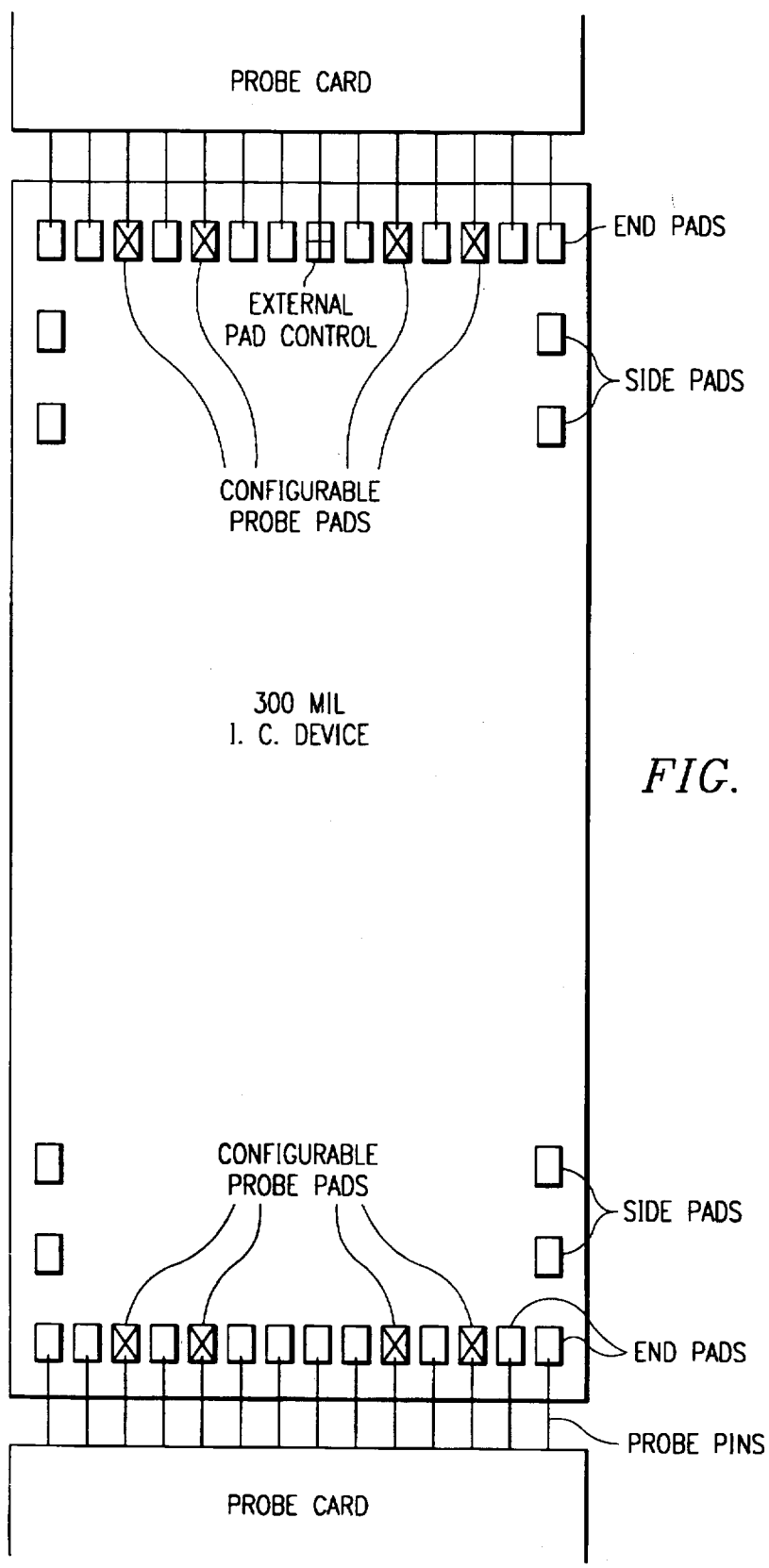
FIG. 2a is a pad diagram of a 28-pin 300 mil SOJ (Small Outline J-Lead) integrated circuit device which illustrates the connection of probe pins of a probe card to configurable probe pads, according to the present invention.
Figure 2B:
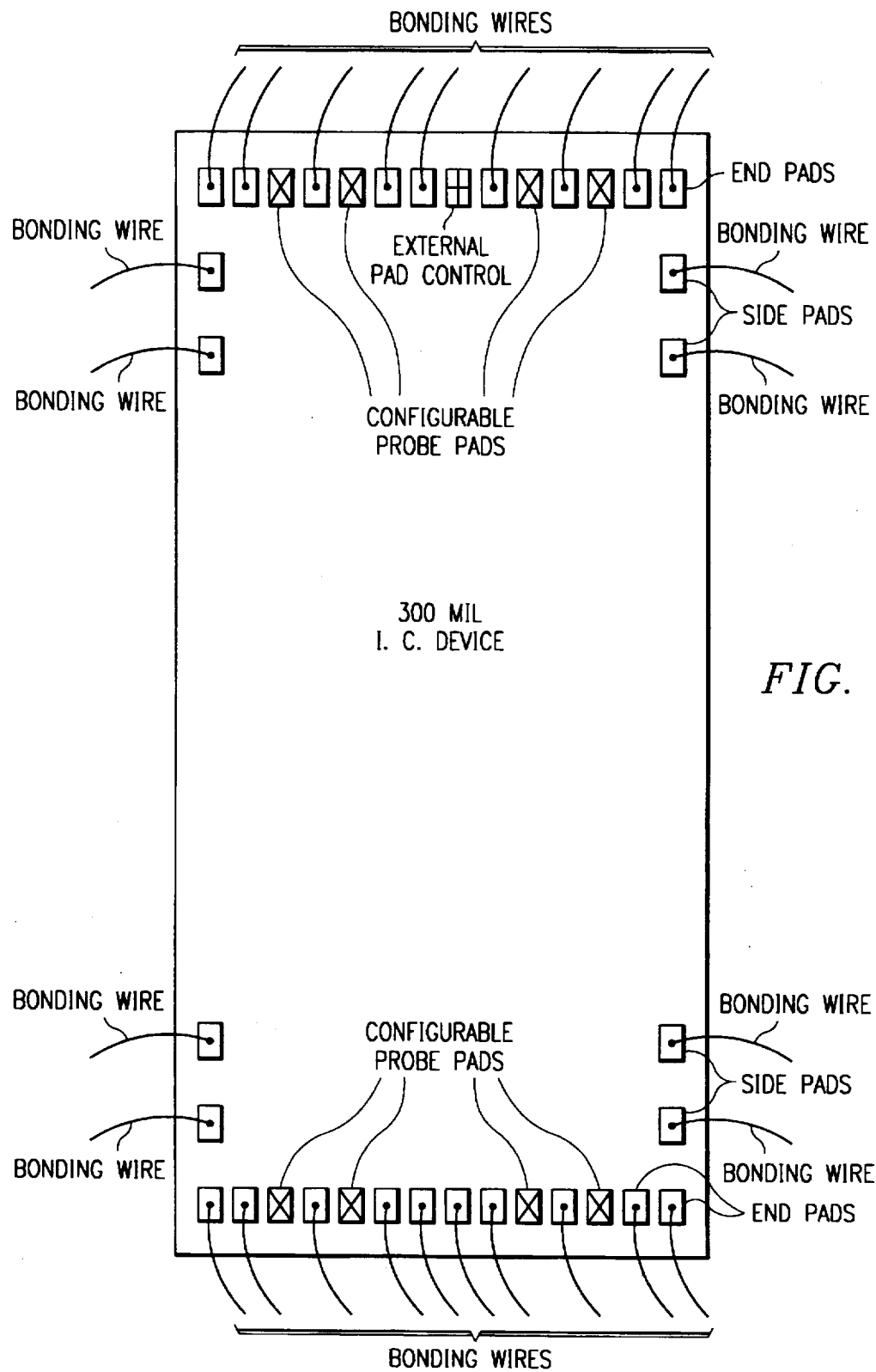

FIG. 2a is a pad diagram of a 28-pin 300 mil SOJ (Small Outline J-Lead) integrated circuit device which illustrates the connection of probe pins of a probe card to configurable probe pads. As shown in FIG. 2a, the present invention allows for parallel testing of any desired number of identical integrated circuit devices by allowing configurable probe pads electrically connected to side pads to be probed during parallel testing. FIG. 2b shows the connection of bonding wires to side pads, thus illustrating that side pads, but not associated configurable probe pads, are down bonded during packaging of the integrated circuit device.

Figure 3:
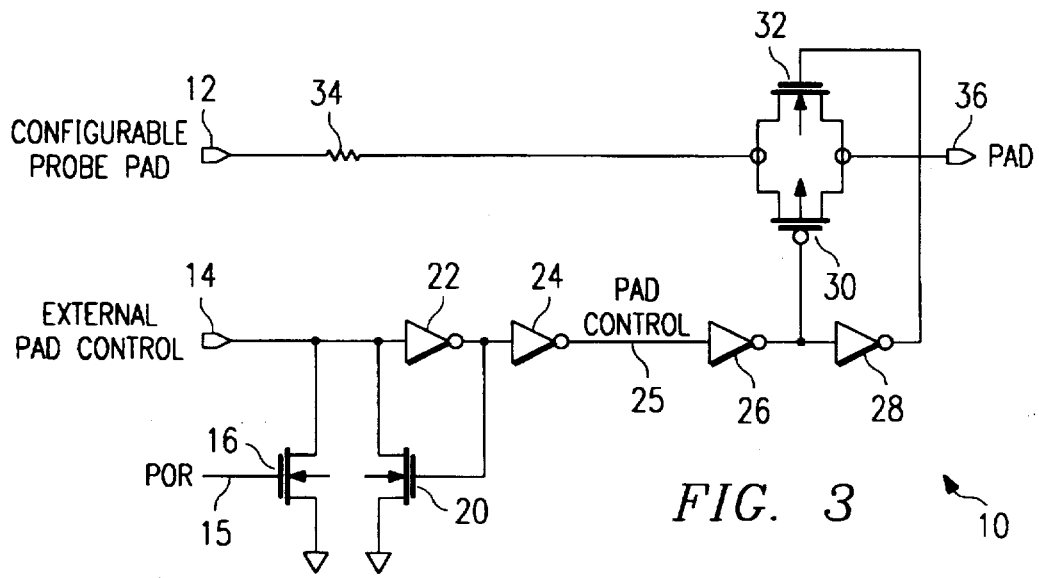
FIG. 3 is a schematic diagram of multiplexing circuitry of an integrated circuit device for connecting a first configurable probe pad to its corresponding pad, according to a first embodiment of the present invention.

Referring to FIG. 3, a schematic diagram of multiplexing circuitry of an integrated circuit device for connecting a first configurable probe pad to its corresponding side pad is shown. The multiplexing circuitry 10 of FIG. 3 is useful in an integrated circuit device featuring a power-on-reset signal (POR). Similar multiplexing circuitry may be utilized in an integrated circuit device which does not have power-on-reset; in this sense, multiplexing circuitry 10 is an example of multiplexing circuitry which could be used.

Figure 3A:
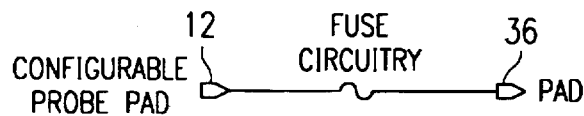
FIG. 3a is a schematic diagram of multiplexing circuitry having fuse circuitry of an integrated circuit device for connecting a first configurable probe pad to its corresponding pad, according to a second embodiment of the present invention.

Multiplexing circuitry 10 of FIG. 3 connects a configurable probe pad 12 to its corresponding side pad 36, such that pad 36 is effectively probed during parallel testing of the integrated circuit device. Pad 36 may be connected to any number of functional pin types of the device, such as an Address pin, a Chip Enable pin, a Write pin, etc. The elements of multiplexing circuitry 10 include: configurable probe pad 12, a second configurable probe pad External Pad Control 14, n-channel MOS transistors 16, 20, 32, p-channel MOS transistor 30, inverters 22, 24, 26, and 28, and resistor 34. Power on Reset (POR) signal 15 is an internally generated signal. The transistors 16, 20, 30, and 32 of multiplexing circuitry 10 are heavily guardringed and therefore physically isolated to prevent potential latch-up problems. Whether configurable probe pad 12 is connected to its corresponding pad 36 is determined by the transmission gate formed by n-channel transistor 32 and p-channel transistor 30; the transmission gate is controlled by Pad Control signal 25, a derivative signal of the POR signal 15, or External Pad Control 15. As shown in FIG. 3a, multiplexing circuitry could also include fuse circuitry for connecting or disconnecting configurable probe pad 12 to pad 36. When it is desirable to disconnect configurable probe pad 12 from pad 36, such as at laser repair, the fuse may be blown.

Pad Control signal 25 is a buffered signal which is driven from the additional configurable probe pad 12 during parallel testing, but which is held low after the integrated circuit device is packaged. An integrated circuit device may have more than one configurable probe pad as shown in FIG. 2 but, according to the invention, only one pad, typically connected to a power supply such as Vss, need be down bonded to the substrate in the finished, packaged device. Thus, in addition to configurable probe pad 12, there is a second configurable probe pad External Pad Control 14 which may be down bonded to the device package in order to disconnect configurable probe pad 12 from pad 36. In some instances, External Pad Control 14 may not need to be down bonded at all.

Figure 4:
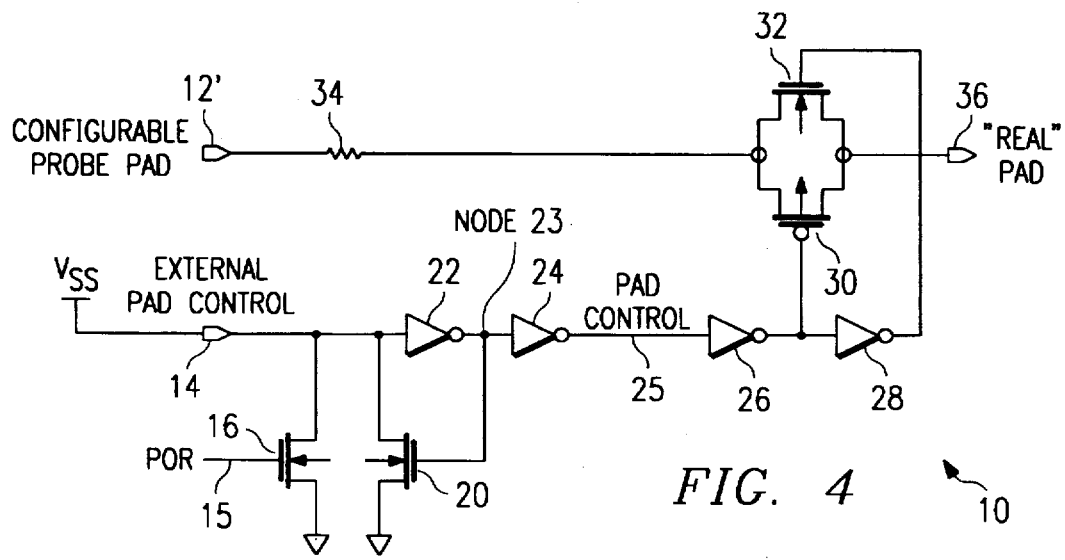
FIG. 4 is a schematic diagram of multiplexing circuitry of an integrated circuit device for connecting a second configurable probe pad to its corresponding pad, according to the present invention.

Referring to FIG. 4, a Vss power supply is supplied to the second configurable probe pad, External Pad Control 14, in order to disconnect configurable probe pad 12 from pad 36; other signals such as Vcc could be supplied to External Pad Control as well. A fuse may be used in place of the transmission gate formed by transistors 30 and 32 to disconnect configurable probe pad 12 from pad 36 in order to reduce the capacitive impact of configurable probe pad 12 during normal operation of the device. Fuse circuitry, however, is a permanent solution that may not be undone.

Vss power supply or some other power supply is supplied to External Pad Control 14 by bonding pad 14 to the appropriate power supply; External Pad Control 14 may also be appropriately controlled by external logic circuitry as well. Applying Vss to this second configurable probe pad 14 operates to turn off all other configurable probe pads, other than External Pad Control 14, during normal operation. Conversely, applying Vcc to External Pad Control 14 turns on the transmission gate formed by transistors 30 and 32 and thus allows control of pad 36 through pad 12. Thus, there is one additional bond pad but the other configurable probe pads are not bonded to the device package and are transparent to the user. As stated above, there are instances where it is not necessary to down bond External Pad Control 14 at all.

In order to control the logic state present on External Pad Control 14, p-channel transistor n-channel transistor 20 forms a latch which may be selectively used. The latch allows there to be no down bonding of External Pad Control 14 when the device is not in the parallel testing mode. N-channel transistor 20 pulls down towards ground potential causing External Pad Control 14 to be latched to a low logic state. When it is desired to enter a parallel testing mode, a tester supplies a high logic signal to External Pad Control 14 and the latch output at node 23 is a low logic level.

Resistor 34, if not shorted out, provides ESD (electrostatic discharge) protection for pad 36 of multiplexing circuitry 10. If there is adequate ESD protection and thus no need for resistor 34, then resistor 34 may be easily shorted out. If pad 36 has adequate ESD protection, it may be sufficient to protect configurable probe pad 12 as well. As previously discussed, the transistors of multiplexing circuitry 10 of FIGS. 3 and 4 are heavily guardringed and physically isolated to avoid potential latch-up problems.

A technique and circuitry for parallel testing of an integrated circuit device which may not necessarily be an "ends only" device has been described so that the test time reduction associated with parallel testing may be realized. Using the present invention, any number of integrated circuit devices may be parallel tested, subject only to the physical constraints of the probe card which provides contact to the integrated circuit devices and the tester which performs the actual testing of the devices. The present invention also allows for ease of packaging following parallel testing of a device since the pads of the device are not moved in order to permit parallel testing. The integrated circuit device to be parallel-tested may be a high density memory device, such as a 1 Meg SRAM device, or it may be any other integrated circuit device. The integrated circuit device to be parallel tested may produce a POR signal, but this is not required. The method and circuitry of the present invention has no negative impact on integrated circuit device performance as well as not having any undesirable effect on area management of the device. Additionally, the present invention has the added advantage of allowing the same probe card to be used for both pre-laser and post-laser testing of memory integrated circuit devices since parallel testing is controlled through External Pad Control 14.

While the invention has been particularly shown and described with reference to a preferred embodiment, it will be understood by those skilled in the art that various changes in form and detail may be made therein without departing from the spirit and scope of the invention.

What is claimed is:

1. An integrated circuit device having configurable probe pads for parallel testing, comprising:

an integrated circuit device, with a first side, a second side, a first end, and a second end, the integrated circuit device having a length dimension and a width dimension, wherein the first side and the second side has a side length equal to the length dimension and the first end and the second end each has an end length equal to the width dimension;

a side pad, located along either the first side or the second side of the integrated circuit device, that is electrically connected to the integrated circuit device;

a first configurable probe pad located along either the first end or the second end of the integrated circuit device that is a test pad dedicated to testing of the integrated circuit device during which the functionality of the entire integrated circuit device is tested; and means for electrically connecting the first configurable probe pad to the side pad in response to a first logic level of a control signal of the integrated circuit device so that the functionality of the entire integrated circuit device may be tested by probing the first configurable probe pad thereby allowing the side pad to maintain its functionality even during testing of the integrated circuit device and for electrically disconnecting the first configurable probe pad from the side pad in response to a second logic level of the control signal during normal operation of the integrated circuit device, wherein the control signal is supplied to a second configurable probe pad, located along either the first end or the second end of the integrated circuit device, that is coupled to the means for electrically connecting the first configurable probe pad to the side pad.

2. The device of claim 1, wherein the second configurable probe pad may be bonded to a supply voltage of the integrated circuit device.

3. An integrated circuit device having configurable probe pads for parallel testing, comprising:

an integrated circuit device, with a first side, a second side, a first end, and a second end, the integrated circuit device having a length dimension and a width dimension, wherein the first side and the second side has a side length equal to the length dimension and the first end and the second end each has an end length equal to the width dimension;

a side pad, located along either the first side or the second side of the integrated circuit device, that is electrically connected to the integrated circuit device;

a first configurable probe pad located along either the first end or the second end of the integrated circuit device that is a test pad dedicated to testing of the integrated circuit device during which the functionality of the entire integrated circuit device is tested; and means for electrically connecting the first configurable probe pad to the side pad in response to a first logic level of a control signal of the integrated circuit device so that the functionality of the entire integrated circuit device may be tested by probing the first configurable probe pad thereby allowing the side pad to maintain its functionality even during testing of the integrated circuit device and for electrically disconnecting the first configurable probe pad from the side pad in response to a second logic level of the control signal during normal operation of the integrated circuit device, wherein the means for electrically connecting the first configurable probe pad to the side pad is a multiplexing circuit comprising a transmission gate circuitry.

4. An integrated circuit device having configurable probe pads for parallel testing, comprising:

an integrated circuit device, with a first side, a second side, a first end, and a second end, the integrated circuit device having a length dimension and a width dimension, wherein the first side and the second side has a side length equal to the length dimension and the first end and the second end each has an end length equal to the width dimension;

a side pad, located along either the first side or the second side of the integrated circuit device, that is electrically connected to the integrated circuit device;

a first configurable probe pad located along either the first end or the second end of the integrated circuit device, that is a test pad dedicated to testing of the integrated circuit device during which the functionality of the entire integrated circuit device is tested, which is electrically connected to the side pad when a control signal of the integrated circuit device is a first logic level so that the functionality of the entire integrated circuit device may be tested by probing the first configurable probe pad thereby allowing the side pad to maintain its functionality even during testing of the integrated circuit device, wherein the control signal selectively causes a multiplexing circuit to disconnect the first configurable probe pad from the side pad when the control signal is a second logic level, wherein the control signal is supplied to a second configurable probe pad, located along either the first end of the second end of the integrated circuit device, that is coupled to the means for electrically connecting the first configurable probe pad to the side pad.

5. The device of claim 4, wherein the second configurable probe pad may be bonded to a supply voltage of the integrated circuit device.

6. An integrated circuit device having configurable probe pads for parallel testing, comprising:

an integrated circuit device, with a first side, a second side, a first end, and a second end, the integrated circuit device having a length dimension and a width dimension, wherein the first side and the second side has a side length equal to the length dimension and the first end and the second end each has an end length equal to the width dimension;

a side pad, located along either the first side or the second side of the integrated circuit device, that is electrically connected to the integrated circuit device;

a first configurable probe pad located along either the first end or the second end of the integrated circuit device, that is a test pad dedicated to testing of the integrated circuit device during which the functionality of the entire integrated circuit device is tested wherein the first configurable probe pad is electrically connected to the side pad by a multiplexing circuit; and a control signal which selectively causes the multiplexing circuit to disconnect the first configurable probe pad from the side pad when the control signal is a first logic level during normal operation of the integrated circuit device and which does not selectively cause the multiplexing circuit to disconnect the first configurable probe pad from the side pad when the control signal is a second logic level so that the functionality of the entire integrated circuit device may be tested by probing the first configurable probe pad thereby allowing the side pad to maintain its functionality even during testing of the integrated circuit device, wherein the control signal is supplied to a second configurable probe pad, located along either the first end or the second end of the integrated circuit device, that is coupled to the means for electrically connecting the first configurable probe pad to the side pad.

7. The device of claim 6, wherein the second configurable probe pad may be bonded to a supply voltage of the integrated circuit device.

8. A method for testing an integrated circuit device, comprising the steps of:

electrically connecting a first configurable probe pad to a side pad electrically connected to the integrated circuit device to be tested, wherein the first configurable probe pad is a test pad added to the integrated circuit device in order to test the integrated circuit device and is not used during normal operation of the integrated circuit device and is located along either a first end or a second end of an integrated circuit device and the side pad is located along either a first side or a second side of the integrated circuit device, the integrated circuit device having a length dimension and a width dimension, wherein the first side and the second side of the integrated circuit device each have a length equal to the length dimension and the first end and the second end of the integrated circuit device each have a length equal to the width dimension;

probing the first configurable probe pad of the integrated circuit device in order to test the integrated circuit device electrically connected to the side pad of the integrated circuit device; and selectively disconnecting the first configurable probe pad from the side pad, wherein the step of selectively disconnecting the first configurable probe pad from the side pad is controlled by a control signal that is supplied to a second configurable probe pad, located along either the first end or the second end of the integrated circuit device, that is coupled to a means that accomplishes selectively disconnecting the first configurable probe pad from the side pad.

9. The method of claim 8, wherein the second configurable probe pad may be bonded to a supply voltage of the integrated circuit device.

10. A method for testing an integrated circuit device, comprising the steps of:

electrically connecting a first configurable probe pad to a side pad electrically connected to the integrated circuit device to be tested, wherein the first configurable probe pad is a test pad added to the integrated circuit device in order to test the integrated circuit device and is not used during normal operation of the integrated circuit device and is located along either a first end or a second end of an integrated circuit device and the side pad is located along either a first side or a second side of the integrated circuit device, the integrated circuit device having a length dimension and a width dimension, wherein the first side and the second side of the integrated circuit device each have a length equal to the length dimension and the first end and the second end of the integrated circuit device each have a length equal to the width dimension;

probing the first configurable probe pad of the integrated circuit device in order to test the integrated circuit device electrically connected to the side pad of the integrated circuit device; and selectively disconnecting the first configurable probe pad from the side pad, wherein the step of selectively disconnecting the first configurable probe pad from the side pad is controlled by a control signal supplied to a second configurable probe pad located along either the first end or the second end of the integrated circuit device, wherein the control signal is a power supply signal.

11. A method for testing an integrated circuit device, comprising the steps of:

electrically connecting a first pad to a second pad electrically connected to the integrated circuit device to be tested, wherein the first pad is a test pad added to the integrated circuit device in order to test the integrated circuit device and is not used during normal operation of the integrated circuit device, and is located along either a first end or a second end of an integrated circuit device and the second pad is located along either a first side or a second side of the integrated circuit device, the integrated circuit device having a length dimension and a width dimension, wherein the first side and the second side of the integrated circuit device each have a length equal to the length dimension and the first end and the second end of the integrated circuit device each have a length equal to the width dimension;

probing the first pad of the integrated circuit device in order to test the integrated circuit device electrically connected to the second pad of the integrated circuit device; and selectively disconnecting the first pad from the second pad, wherein the step of selectively disconnecting the first pad from the second pad is controlled by a control signal supplied to a third pad located along either the first end or the second end of the integrated circuit device, wherein the control signal is a power supply signal.

* * * * *